US012595564B2

(12) United States Patent
Inomata et al.

(10) Patent No.: US 12,595,564 B2
(45) Date of Patent: Apr. 7, 2026

(54) METHOD OF FORMING SURFACE TREATMENT FILM

(71) Applicant: TOKYO OHKA KOGYO CO., LTD., Kawasaki (JP)

(72) Inventors: Koya Inomata, Kawasaki (JP); Daichi Tanaka, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 0 days.

(21) Appl. No.: 18/662,778

(22) Filed: May 13, 2024

(65) Prior Publication Data

US 2024/0384418 A1 Nov. 21, 2024

(30) Foreign Application Priority Data

May 17, 2023 (JP) ................................. 2023-081352

(51) Int. Cl.
*C23C 16/56* (2006.01)
*C23C 16/02* (2006.01)
(Continued)

(52) U.S. Cl.
CPC .......... *C23C 16/56* (2013.01); *C23C 16/0227* (2013.01); *C23C 16/45525* (2013.01);
(Continued)

(58) Field of Classification Search
CPC ................ C23C 16/02; C23C 16/0227; C23C 16/45525; C23C 16/56; C23C 14/02;
(Continued)

(56) References Cited

U.S. PATENT DOCUMENTS

| 10,460,930 | B2 * | 10/2019 | Hausmann | .............. C23C 16/04 |
| 12,152,304 | B2 * | 11/2024 | Azumo | ............... C23C 16/0227 |

(Continued)

FOREIGN PATENT DOCUMENTS

| JP | 2003-508897 A | 3/2003 |
| JP | 2018-137435 A | 8/2018 |
| WO | WO 01/15220 A1 | 3/2001 |

OTHER PUBLICATIONS

Hashemi,et al., "A new resist for area selective atomic and molecular layer deposition on metal-dielectric patterns." *The Journal of Physical Chemistry C* 118.20 (2014): 10957-10962.

(Continued)

*Primary Examiner* — Brian K Talbot
(74) *Attorney, Agent, or Firm* — Knobbe, Martens, Olson & Bear, LLP

(57) ABSTRACT

A method of forming a surface treatment film on a substrate having, on a surface thereof, a first region where an insulator is exposed and a second region where at least one metallic matter is exposed, in which the surface treatment film is formed on the second region and is capable of suppressing intrusion of the surface treatment film onto the first region. A method of forming a surface treatment film, including preparing the substrate, oxidizing a surface of the second region, and forming a surface treatment film on the second region by exposing a surface of the substrate after the oxidation to a surface-treatment agent including a thiol having 8 or less carbon atoms.

6 Claims, 5 Drawing Sheets

(51) Int. Cl.

| | |
|---|---|
| *C23C 16/455* | (2006.01) |
| *H10P 14/24* | (2026.01) |
| *H10P 14/43* | (2026.01) |
| *H10P 14/60* | (2026.01) |
| *H10P 70/00* | (2026.01) |

(52) U.S. Cl.

CPC .............. *H10P 14/24* (2026.01); *H10P 14/43* (2026.01); *H10P 14/432* (2026.01); *H10P 14/6304* (2026.01); *H10P 14/6502* (2026.01); *H10P 70/15* (2026.01)

(58) Field of Classification Search

CPC . C23C 14/58; C23C 14/5873; H01L 21/0223; H01L 21/02052; H01L 21/02299; H01L 21/0262; H01L 21/28556; H01L 21/28562; H10P 70/15; H10P 14/24; H10P 14/43; H10P 14/432; H10P 14/6304; H10P 14/6502

USPC ................................................ 427/299, 336

See application file for complete search history.

(56) References Cited

U.S. PATENT DOCUMENTS

| | | | | |
|---|---|---|---|---|
| 2012/0330047 | A1* | 12/2012 | Shinkai ................. | G03F 7/0755 556/441 |
| 2018/0233350 | A1 | 8/2018 | Tois et al. | |

| | | | | |
|---|---|---|---|---|
| 2019/0164762 | A1* | 5/2019 | Su ..................... | H01L 21/76897 |
| 2020/0234943 | A1* | 7/2020 | Bhuyan ............... | H01L 21/0217 |
| 2021/0074584 | A1* | 3/2021 | Tapily ................. | C23C 16/0236 |
| 2021/0087691 | A1* | 3/2021 | Azumo ............ | H01L 21/02244 |
| 2021/0189146 | A1* | 6/2021 | Noh ........................ | H10P 14/61 |
| 2021/0398849 | A1* | 12/2021 | Tapily ................ | H10W 20/056 |
| 2022/0238323 | A1* | 7/2022 | Clark ..................... | C23C 16/04 |
| 2023/0154757 | A1* | 5/2023 | Lionti .................... | C23C 16/04 438/674 |
| 2024/0327976 | A1* | 10/2024 | Nakatani ................ | H01L 21/31 |
| 2024/0363410 | A1* | 10/2024 | Yonezawa ......... | H01L 21/76804 |

OTHER PUBLICATIONS

Bhadra et al. (2015), "Studies on varying n-alkanethiol chain lengths on gold coated surface and their effect on antibody-antigen binding efficiency." *RSC Adv*, 5, 80480-80487.

Cui et al. "Assessing the apparent effective thickness of alkanethiol self-assembled monolayers in different concentrations of Fe(CN)63-/Fe(CN)64—by ac impedance spectroscopy." *Journal of Electroanalytical Chemistry*, vol. 470, Issue 1, 1999, pp. 9-13, available at https://www.sciencedirect.com/science/article/abs/pii/S0022072899002016 (downloaded Aug. 19, 2025).

Liu, Y. (2013), "Self-assembled Monolayers." In: Wang, Q.J., Chung, YW. (eds) *Encyclopedia of Tribology*, Springer, Boston, MA (abstract only).

Taguchi et al. (2002), "Crystal Growth of Isotactic Polystyrene in Ultrathin Films: Film Thickness Dependence." *Journal of Macromolecular Science*, Part B, 41(4-6), 1033-1042.

* cited by examiner

METHOD OF FORMING SURFACE TREATMENT FILM

This application claims priority to Japanese Patent Application No. 2023-081352, filed May 17, 2023, the entire content of which is incorporated herein by reference.

BACKGROUND OF THE INVENTION

Field of the Invention

The present invention relates to a method of forming a surface treatment film.

Related Art

In recent years, trends toward higher integration and miniaturization of semiconductor devices have grown. Due to this, miniaturization of a patterned organic film serving as a mask and an inorganic patterned film prepared by an etching process has advanced. Thus, film thickness control in an atomic layer level has been demanded for organic films or inorganic films formed on semiconductor substrates. As a method of forming a thin film on a substrate in the atomic layer level, an atomic layer deposition (ALD) method (hereinafter, also simply referred to as an "ALD method"), which is one type of Chemical Vapor Deposition (CVD), has been known. Among the chemical vapor deposition (CVD) method, the ALD method is known to concomitantly have high step difference covering properties (step coverage) and film-thickness controllability.

The ALD method is a thin film formation technique in which two types of gases each having, as a main component, an element(s) to form the film are alternately supplied onto a substrate to form a thin film on the substrate in atomic layer units, and this treatment is repeated a plurality of times to form a film having a desired thickness. The ALD method makes use of a deposition self-controlling function (self-limiting function), in which, during supply of raw material gases, only components of the raw material gases to form one or a few atomic layers are adsorbed onto a substrate surface, while excess raw material gas does not contribute to the deposition. For example, to form an $Al_2O_3$ film on a substrate, a raw material gas composed of trimethyl aluminum (TMA) and an oxidizing gas including oxygen are used. To form a nitride film on a substrate, a nitriding gas is used instead of the oxidizing gas.

In recent years, a method for region-selectively producing a film on a substrate surface has been attempted by using the ALD method (see Patent Document 1 and Non-Patent Document 1). Due to this, a substrate having a surface modified in a region-selective manner has been demanded, so that the substrate surface can be suitably applied in the method for region-selectively producing a film on the substrate by the ALD method. As a method for obtaining a substrate having such a region-selectively modified surface, Patent Document 2 discloses a method of forming a self-assembled monolayer (SAM) of a sulfur-containing monomer (1-dodecanethiol), among a first surface (dielectric material) and a second surface (made of metal), selectively on the second surface (made of metal).

Patent Document 1: Japanese Unexamined Patent Application (Translation of PCT Application), Publication No. 2003-508897

Patent Document 2: Japanese Unexamined Patent Application, Publication No. 2018-137435

Non-Patent Document 1: J. Phys. Chem. C 2014, 118, 10957-10962

SUMMARY OF THE INVENTION

As shown in FIGS. 1A to 1D, in a substrate 1 having, on a surface thereof, a first region 11 where an insulator is exposed and a second region 12 where at least one metallic matter selected from a metal or a conductive metal-containing compound is exposed (FIG. 1A), once an SAM 13 including an organic compound having a mercapto group (SH) is formed on the second region 12 as a surface treatment film (FIG. 1B), thereafter, an insulator film 14 made of $SiO_2$ or the like can be selectively formed on the first region 11 by a CVD method such as an ALD method (FIG. 1C). A thick insulator film 14 may be desired but when the insulator film 14 to be formed is significantly thicker than the SAM 13, there arises a problem that a side of the insulator film 14 opposite to the first region 11 protrudes toward a second region 12 side and forms an "overhang" (FIG. 1D). In order to suppress such an overhang of the insulator film 14, it is conceivable to increase the film thickness of the SAM 13 as shown in FIG. 2A. However, increasing the film thickness of the SAM 13, there arises a problem that the SAM 13 intrudes onto the surface of the first region 11 (FIG. 2B). This problem becomes remarkable particularly when the first region 11 and the second region 12 are fine. Note that FIGS. 1A to 1D are schematic cross-sectional views illustrating the overhang, and FIGS. 2A to 2B are schematic cross-sectional views illustrating the intrusion of the SAM onto the first region.

The present invention has been made in view of the above circumstances, and an object of the present invention is to provide a method of forming a surface treatment film on a substrate having, on a surface thereof, a first region where an insulator is exposed and a second region where at least one metallic matter selected from a metal or a conductive metal-containing compound is exposed, in which the method forms the surface treatment film on the second region and is capable of suppressing intrusion of the surface treatment film onto the first region even when the film thickness of the surface treatment film is large.

The present inventors have found that the above problems can be solved by a method of forming a surface treatment film, comprising: a substrate preparation step of preparing a substrate having, on a surface thereof, a first region where an insulator is exposed and a second region where at least one metallic matter selected from a metal or a conductive metal-containing compound is exposed; an oxidation step of oxidizing a surface of the second region; and an exposure step of forming a surface treatment film on the second region by exposing the surface of the substrate after the oxidation step to a surface-treatment agent containing a thiol having 8 or less carbon atoms, arriving at the completion of the present invention. Specifically, the present invention provides the following.

A first aspect of the present invention relates to a method of forming a surface treatment film, including a substrate preparation step of preparing a substrate having, on a surface thereof, a first region where an insulator is exposed and a second region where at least one metallic matter selected from a metal or a conductive metal-containing compound is exposed, an oxidation step of oxidizing a surface of the second region, and an exposure step of forming a surface treatment film on the second region by exposing a surface of the substrate after the oxidation step to a surface-treatment agent containing a thiol having 8 or less carbon atoms.

A second aspect of the present invention relates to the method of forming a surface treatment film as described in the first aspect, in which the insulator has a recess on a surface thereof and the second region where the metallic matter is exposed is formed in the recess.

A third aspect of the present invention relates to the method of forming a surface treatment film as described in the first or second aspect, in which the insulator is at least one type selected from the group consisting of silicon oxide, aluminum oxide, titanium oxide, zirconium oxide, hafnium oxide, tantalum oxide, a fluorine-containing silicon oxide, a carbon-containing silicon oxide, silicon nitride, boron nitride, silicon carbide, silicon carbonitride, silicon oxynitride, silicon oxycarbonitride, silicon, and silicon doped with at least one type selected from phosphorus, boron, or germanium, and the metallic matter is at least one type selected from the group consisting of copper, cobalt, molybdenum, and ruthenium.

A fourth aspect of the present invention relates to the method of forming a surface treatment film as described in any one of the first to third aspects, in which the thiol includes at least one type selected from butanethiol, pentanethiol, hexanethiol, heptanethiol, or octanethiol.

A fifth aspect of the present invention relates to the method of forming a surface treatment film as described in any one of the first to fourth aspects, further including a solvent cleaning step of cleaning the substrate having the surface treatment film formed thereon with a solvent after the exposure step.

A sixth aspect of the present invention relates to the method of forming a surface treatment film as described in the fifth aspect, in which the solvent includes a fatty acid alkyl ester.

A seventh aspect of the present invention relates to the method of forming a surface treatment film as described in any one of the first to sixth aspects, in which the surface treatment film has a film thickness of 10 nm or more.

According to the present invention, it is possible to provide a method of forming a surface treatment film on a substrate having, on a surface thereof, a first region where an insulator is exposed and a second region where at least one metallic matter selected from a metal or a conductive metal-containing compound is exposed, in which the method forms the surface treatment film on the second region and the method is capable of suppressing intrusion of the surface treatment film onto the first region.

BRIEF DESCRIPTION OF THE DRAWINGS

FIGS. 3A to 3C are schematic cross-sectional views illustrating a method of forming a surface treatment film;

DETAILED DESCRIPTION OF THE INVENTION

Method of Forming Surface treatment film

Figure 1A:
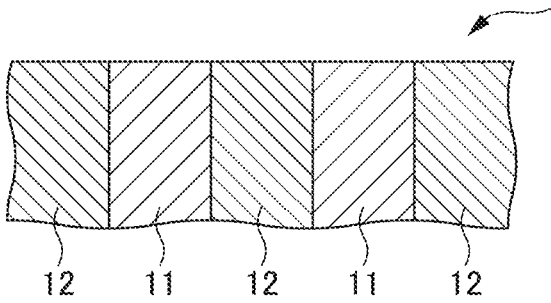
FIGS. 1A to 1D are schematic cross-sectional views illustrating overhang.
Figure 1B:
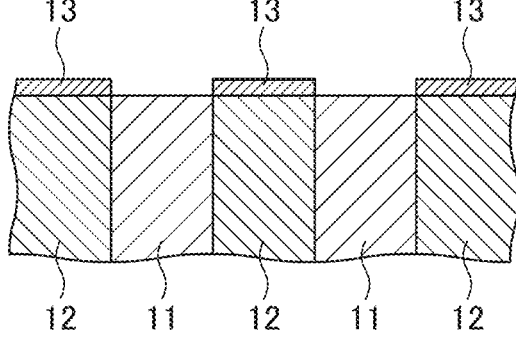
Figure 1C:
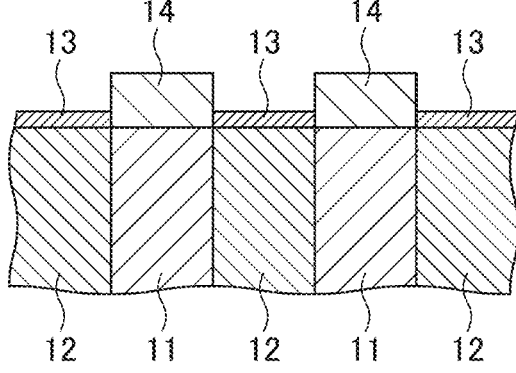
Figure 1D:
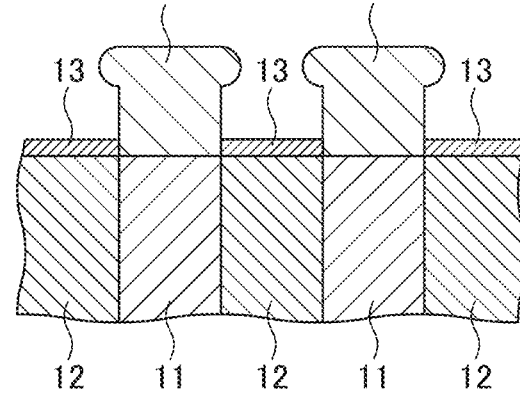
Figure 2A:
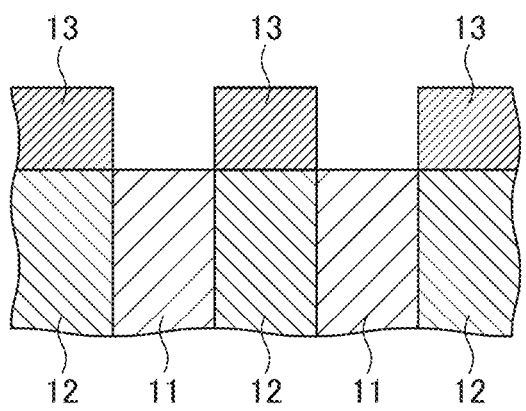
FIGS. 2A and 2B are schematic cross-sectional views illustrating intrusion of a SAM onto a first region.
Figure 2B:
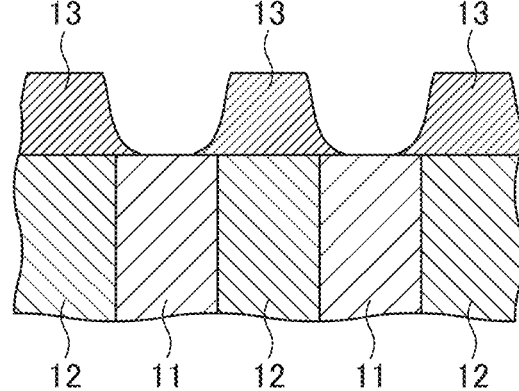
Figures 3A, 3B, 3C:
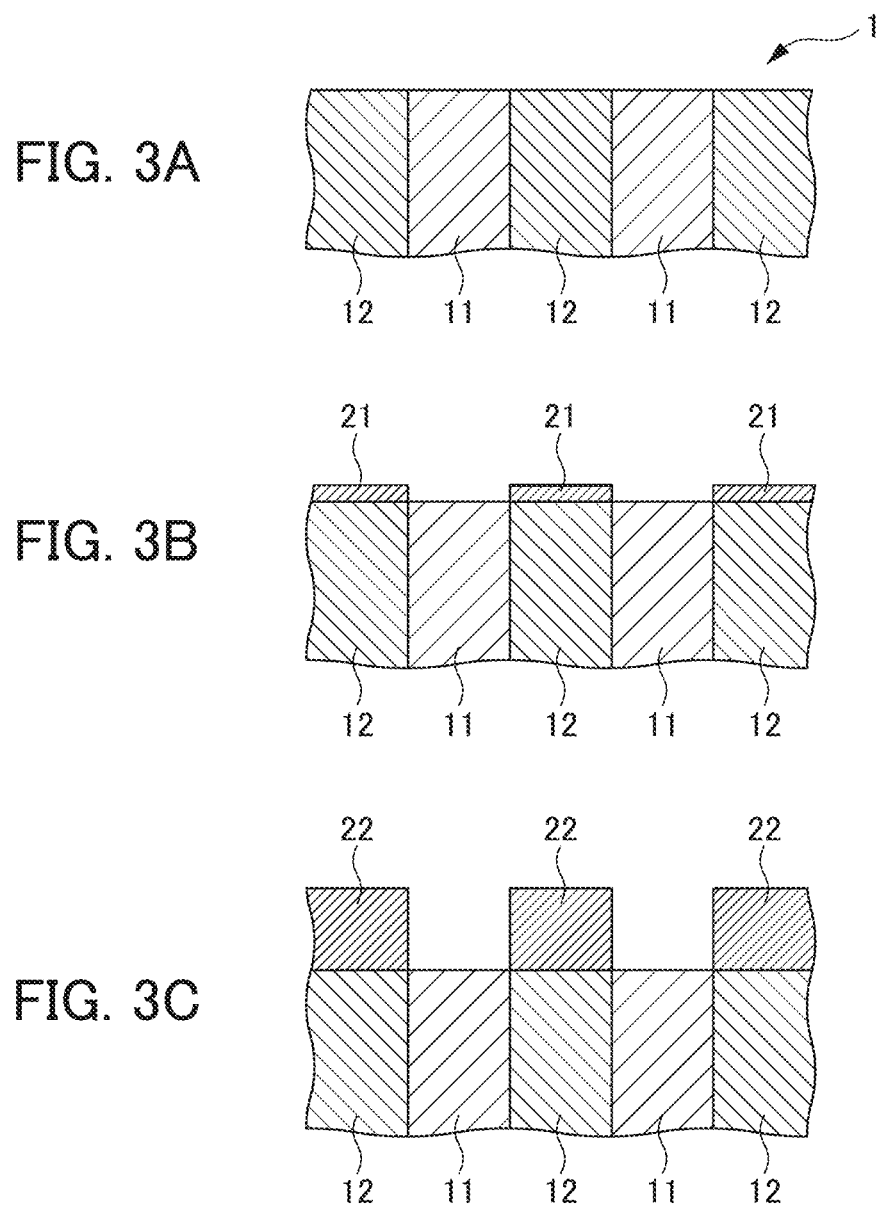
Figure 4A:
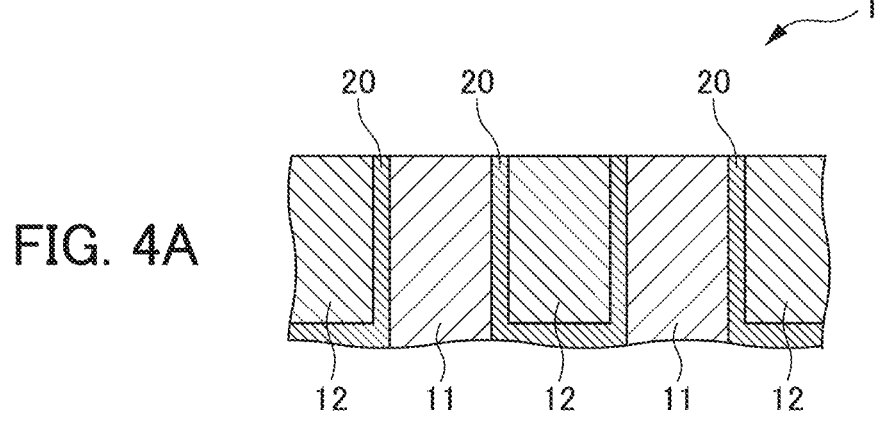
FIGS. 4A and 4B are schematic cross-sectional views illustrating another example of a substrate.
Figure 4B:
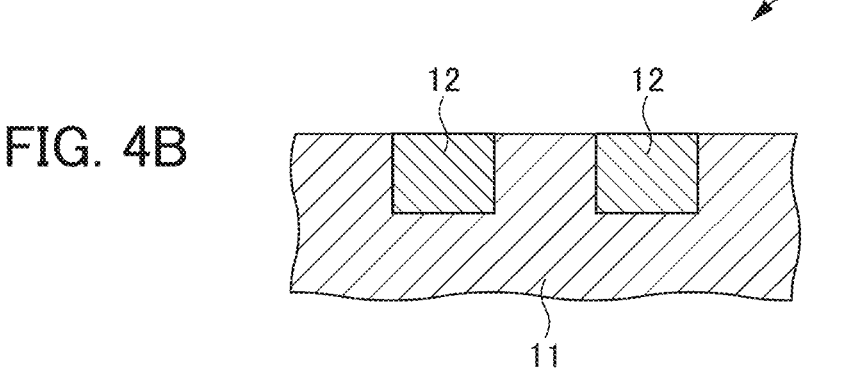

The method of forming a surface treatment film includes a substrate preparation step of preparing a substrate having, on a surface thereof, a first region where an insulator is exposed and a second region where at least one metallic matter selected from a metal or a conductive metal-containing compound is exposed, an oxidation step of oxidizing a surface of the second region, and an exposure step of forming a surface treatment film on the second region by exposing a surface of the substrate after the oxidation step to a surface-treatment agent including a thiol having 8 or less carbon atoms. Hereinafter, each step will be described with reference to FIGS. 3A to 3C and FIGS. 4A and 4B. FIGS. 3A to 3C are schematic cross-sectional views illustrating the method of forming a surface treatment film. FIGS. 4A and 4B are schematic cross-sectional views illustrating another example of the substrate.

Substrate Preparation Step

In the substrate preparation step, a substrate 1 having, on a surface thereof, a first region 11 where an insulator is exposed and a second region 12 where at least one metallic matter selected from a metal or a conductive metal-containing compound is exposed is prepared (FIG. 3A).

Substrate

The substrate 1 has, on a surface thereof, a first region 11 where an insulator is exposed and a second region 12 where at least one metallic matter selected from a metal or a conductive metal-containing compound is exposed. It is preferable that the first region 11 where the insulator is exposed and the second region 12 where at least one metallic matter selected from a metal or a conductive metal-containing compound is exposed are adjacent to each other between at least one first region 11 and at least one second region 12. Here, being adjacent includes a case (FIG. 3A) in which at least one first region 11 and at least one second region 12 share a boundary line and are adjacent to each other, or a case in which they are adjacent to each other without sharing a boundary line or they are spaced apart without sharing a boundary line. Examples of the latter case in which they are adjacent to each other without sharing a boundary line or they are spaced apart without sharing a boundary line include a structure in which the second region 12 where a metallic matter is exposed is a wiring metal, the second region 12 is covered with a barrier metal (refractory metal film used for preventing deterioration of performance of semiconductor device and the like due to diffusion of wiring metal into the first region and the like) 20, and this barrier metal 20 and the first region 11 are in contact with each other, as shown in FIG. 4A. In this case, the substrate 1 has, on a surface thereof, the first region 11 where an insulator is exposed, the second region 12 where a metallic matter is exposed, and a region (third region) where the barrier metal 20 is exposed. In addition, as illustrated in FIG. 4B, the insulator (the first region 11) may have a recess on the surface of the substrate 1, and the second region 12 in which a metallic matter is exposed may be formed in the recess. In addition, the metallic matter (second region 12) may have a recess on the surface of the substrate 1 and the first region 11 where an insulator is exposed may be formed in this recess. The number of each of the first region 11 and the second region 12 may be one or two or more. In addition, the substrate 1 may have one or two or more regions other than the first region 11 and the second region 12 (a third region made of a material different from those of the first region 11 and the second region 12).

Examples of the substrate 1 having, on a surface thereof, the first region 11 where an insulator is exposed and the second region 12 where a metallic matter is exposed include a base substrate (not shown) such as a substrate or the like used for the production of a semiconductor device, the base substrate having, on a surface thereof, an inorganic layer constituting the first region 11 where an insulator is exposed and an inorganic layer constituting the second region 12 where a metallic matter is exposed. In addition, the substrate 1 having the first region 11 where an insulator is exposed and the second region 12 where a metallic matter is exposed on the surface may be a substrate where the surface of the base substrate is the first region 11 where an insulator is exposed and an inorganic layer constituting the second region 12 where a metallic matter is exposed is formed on the surface of the base substrate. In addition, the substrate 1 having the first region 11 where an insulator is exposed and the second region 12 where a metallic matter is exposed on the surface may be a substrate where the surface of the base substrate is the second region 12 where a metallic matter is exposed and an inorganic layer constituting the first region 11 where an insulator is exposed is formed on the surface of the base substrate. The inorganic layer may be patterned or unpatterned. The substrate 1 may not have a base substrate.

As the base substrate, a substrate used for producing a semiconductor device can be exemplified. Examples of such a substrate include a silicon (Si) substrate, a silicon nitride (SiN) substrate, a silicone oxide film (SiOx) substrate, a tungsten (W) substrate, a cobalt (Co) substrate, a germanium (Ge) substrate, an aluminum (Al) substrate, a nickel (Ni) substrate, a ruthenium (Ru) substrate, a copper (Cu) substrate, a titanium nitride (TiN) substrate, a tantalum nitride (TaN) substrate, a silicon germanium (SiGe) substrate, and the like or a substrate having a patterned inorganic layer or an unpatterned inorganic layer provided on the above-mentioned substrates. Examples of the inorganic layer include a patterned inorganic layer formed by producing an etching mask on the surface of an inorganic layer present on the substrate by way of a photoresist method, followed by an etching process; and a patterned inorganic layer formed on the substrate surface by way of the atomic layer deposition (ALD method). Examples of the inorganic layer include an inorganic layer formed in a production process of a semiconductor device. Examples of the inorganic layer include a naturally oxidized film of an element constituting the substrate; and a film or a layer of an inorganic material formed on the substrate surface, such as silicon nitride (SiN), silicon oxide film (SiOx), tungsten (W), cobalt (Co), germanium (Ge), aluminum (Al), nickel (Ni), ruthenium (Ru), copper (Cu), silver (Ag), titanium (Ti), gold (Au), chromium (Cr), molybdenum (Mo), aluminum oxide ($Al_2O_3$), titanium oxide ($TiO_2$), zirconium oxide ($ZrO_2$), hafnium oxide ($HfO_2$), tantalum oxide ($Ta_2O_5$), titanium nitride (TiN), tantalum nitride (TaN), silicon germanium (SiGe), and silicon oxide ($SiO_2$).

First Region

In the first region 11, an insulator is exposed. That is, the first region 11 has an insulator on a surface thereof. The insulator of the first region 11 is composed of at least one insulating compound selected from the group consisting of oxides, nitrides, carbides, carbonitrides, oxynitrides, oxycarbonitrides, insulating resins, and semiconductors; and oxides, nitrides, carbides, carbonitrides, oxynitrides or oxycarbonitrides are preferred. As the oxides, silicon oxide ($SiO_x$ (1≤X≤2)), aluminum oxide ($Al_2O_3$), titanium oxide ($TiO_2$), zirconium oxide ($ZrO_2$), hafnium oxide ($HfO_2$), tantalum oxide ($Ta_2O_5$), a fluorine-containing silicon oxide (SiOF), and a carbon-containing silicon oxide (SiOC) are preferred. Preferable examples of the nitrides include silicon nitride (SiN) and boron nitride (BN). A preferable example of the carbides includes silicon carbide (SiC). A preferable example of the carbonitrides includes silicon carbonitride (SiCN). A preferable example of the oxynitrides includes silicon oxynitride (SiON). As the oxycarbonitrides, silicon oxycarbonitride (SiOCN) is preferred. As the insulating resins, polyimides, polyesters, and plastic resins can be mentioned. As the semiconductors, silicon or silicon doped with at least one type selected from phosphorus, boron, or germanium is preferable.

Second Region

In the second region 12, at least one metallic matter selected from a metal or a conductive metal-containing compound is exposed. That is, the second region 12 has at least one metallic matter selected from a metal or a conductive metal-containing compound on a surface thereof. The at least one metallic matter selected from a metal or a conductive metal-containing compound of the second region 12 may be defined as a conductor relative to the insulator of the first region 11. The metal may be a pure metal composed of a single metal element or an alloy. As the metallic matter, copper (Cu), cobalt (Co), molybdenum (Mo), ruthenium (Ru), a copper alloy containing 90 at % or more of Cu, a cobalt alloy containing 90 at % or more of Co, and the like are preferable.

Pretreatment of Substrate Surface

The surface of the substrate 1 is preferably pretreated. A treatment agent for pretreating a substrate surface of the substrate 1 (hereinafter, sometimes referred to as "pretreatment agent") is not particularly limited as long as it can remove an organic matter present on the substrate surface. Examples of the pretreatment agent include peroxides such as hydrogen peroxide, perhalic acids such as periodic acid, oxo acids such as nitric acid and hypochlorous acid, phosphoric acid, citric acid, acetic acid, hydrofluoric acid (HF), and the like. The pretreatment agent may be appropriately selected depending on the type of the substrate to be used, and for example, at least one type selected from the group consisting of hydrogen peroxide and a perhalic acid is preferable from the viewpoint of treating a metal surface without damaging an inorganic substance such as $SiO_2$ or $Al_2O_3$ when the inorganic substance concomitantly exists on the substrate surface. On the other hand, in the case of a substrate containing Cu, it is preferable to use an aqueous HF solution, acetic acid, citric acid, phosphoric acid, nitric acid, or the like as the pretreatment agent. The pretreatment agent may be used alone, or two or more types thereof may be used.

Oxidation Step

In the oxidation step, the substrate prepared in the substrate preparation step is oxidized. The substrate to be oxidized in the oxidation step may be a substrate in which the metallic material in the second region 12 of the substrate prepared in the substrate preparation step is oxidized to form a natural oxide film.

By the oxidation step, a surface of the metallic matter in the second region 12 is oxidized or the natural oxide film formed on the surface of the metallic matter in the second region 12 is further oxidized, and thus a metal oxide layer 21 including a metal oxide which results from oxidation of the metallic matter is formed on the surface of the second region 12 (FIG. 3B). For example, when the metallic matter of the second region 12 is Cu, the metal oxide layer 21 including CuO is formed by the oxidation step.

Although a method of oxidizing the substrate is not particularly limited, it is preferable to oxidize the substrate using at least one of ozone or hydrogen peroxide as an oxidizing agent. Examples of the method include a method of oxidizing the substrate 1 (accordingly, the metallic matter of the second region 12 or a natural oxide film formed on the surface of the metallic matter of the second region 12) with ozone or atomic oxygen generated by ozone dissociation by irradiating an oxygen-containing gas such as air with ultraviolet rays (UV $O_3$), or a method of oxidizing the substrate 1 by dipping the substrate 1 in a hydrogen peroxide solution.

Here, when a natural oxide film is formed on the substrate prepared in the substrate preparation step, the natural oxide film may include metal oxides each having a different valence. For example, when the metallic matter of the second region 12 is Cu, the natural oxide film on the substrate surface may include CuO and $Cu_2O$. The metal oxide layer 21 consisting of CuO can be formed by the above-described method (UV $O_3$) including oxidizing the substrate with ozone or atomic oxygen generated by ozone dissociation by irradiating the oxygen-containing gas with ultraviolet rays, or a method of dipping a substrate in a hydrogen peroxide solution. Note that CuO can be easily reduced by a surface-treatment agent in a subsequent exposure step.

Exposure Step

In the exposure step, after the oxidation step, the surface of the substrate is exposed to a surface-treatment agent containing a thiol having 8 or less carbon atoms to form a surface treatment film on the second region. After the oxidation step, by exposing the surface of the substrate to the surface-treatment agent containing a thiol having 8 or less carbon atoms, a surface treatment film 22 derived from the thiol having 8 or less carbon atoms is selectively formed on the second region 12 among the first region 11 and the second region 12 as shown in Examples described later (FIG. 3C). Even when the surface treatment film 22 formed has a large thickness (for example, the film thickness of the surface treatment film 22 of 10 nm or more), it is possible to suppress the surface treatment film 22 from intruding onto the first region 11 as described in an Example to be described later. Therefore, a surface treatment film 22 having good rectangularity can be formed on the second region 12.

Intrusion of the surface treatment film 22 onto the first region 11 can be suppressed by the following mechanism, even when the surface treatment film 22 has a large film thickness. At the same time as an organic compound having a mercapto group (SH) is likely to donate and accept electrons to and from a metal oxide, such an organic compound is unlikely to react with an insulator which is unlikely to donate and accept electrons. Therefore, the thiol having 8 or less carbon atoms selectively reacts with (for example, adsorbs onto) the metal oxide layer 21 formed on the surface of the second region 12. The thiol having 8 or less carbon atoms reduces the metal oxide layer 21 into a metal and turns into a disulfide to form a self-assembled monolayer (SAM) on the metal surface of the second region 12. Note that the SAM derived from the thiol having 8 or less carbon atoms improves a contact angle of water on the surface of the second region 12. A part of the metal generated by reducing the metal oxide layer 21 functions as an adhesive to the SAM. As a result, a structure in which SAM and metal are alternately repeated may be formed, including a—SAM—metal—SAM—bond. For this reason, it is considered that the surface treatment film 22 can be made thicker than the SAM, which is a monomolecular film. The surface treatment film 22 can also be said to be a multilayer film where SAMs of a thiol having 8 or less carbon atoms are laminated via metals. Here, when the film thickness of the surface treatment film 22 is increased, there arises a problem that the surface treatment film 22 intrudes onto the surface of the first region 11. However, by using the thiol having 8 or less carbon atoms, it is possible to suppress the surface treatment film 22 from intruding onto the first region

11 due to the number of carbon atoms. Even when the first region 11 and the second region 12 are fine (for example, when the narrowest portion of the first region 11 or the second region 12 in a plan view of the first region 11 and the second region 12 is 20 nm or more and 80 nm or less), the intrusion of the surface treatment film 22 onto the first region 11 can be prevented. On the other hand, when a thiol having more than 8 carbon atoms is used, though the film thickness can be increased to some extent, the intrusion of the surface treatment film 22 onto the first region 11 increases, resulting in deterioration of the rectangularity of the surface treatment film 22.

Surface-Treatment Agent

The surface-treatment agent used in the exposure step includes a thiol having 8 or less carbon atoms.

The number of carbon atoms of the thiol contained in the surface-treatment agent of 8 or less may be fine, but is preferably 6 or less, and more preferably 5 or less. The lower limit of the number of carbon atoms of the thiol contained in the surface-treatment agent is not particularly limited, but is preferably 3 or more.

The thiol having 8 or less carbon atoms may be an alkanethiol or an aromatic thiol. An alkyl group of the alkanethiol may be linear or branched, but is preferably linear. Examples of the alkanethiol include butanethiol, pentanethiol, hexanethiol, heptanethiol, and octanethiol. Examples of the aromatic thiol include toluene thiol and benzene thiol.

The thiol having 8 or less carbon atoms may be used alone, or two or more types may be used.

The content of the thiol having 8 or less carbon atoms in the surface-treatment agent is not particularly limited, but is preferably 0.001% by mass or more and 20% by mass or less, more preferably 0.05% by mass or more and 10% by mass or less, and further preferably 0.1% by mass or more and 5% by mass or less with respect to the total mass of the surface-treatment agent.

The surface-treatment agent may contain a solvent or may be substantially free of solvent. From the viewpoint of easiness of surface treatment of the substrate by a dipping method, a spin coating method, or the like, the surface-treatment agent preferably contains a solvent. When the surface-treatment agent is substantially free of solvent, the content of the solvent in the surface-treatment agent is 5 mass % or less, preferably 1 mass % or less, and more preferably 0.1 mass % or less. In a case where the surface-treatment agent includes a solvent, the blending amount of the solvent may be appropriately adjusted, for example, in a range of more than 5% by mass and 99.99% by mass or less. For example, the balance of the thiol having 8 or less carbon atoms contained in the surface-treatment agent may be the blending amount of the solvent. In a case where the surface-treatment agent includes a solvent, specifically, the blending amount of the solvent is preferably 80% by mass or more and 99.9% by mass or less and more preferably 90% by mass or more and 99.5% by mass or less.

The solvent may be an organic solvent or water. Examples of the organic solvent include: sulfoxides, sulfones, amides, lactams, imidazolidinones, dialkyl glycol ethers, monoalcohol-based solvents, (poly)alkylene glycol monoalkyl ethers, (poly)alkylene glycol monoalkyl ether acetates, other ethers, ketones, other esters, lactones, linear, branched, or cyclic aliphatic hydrocarbons, aromatic hydrocarbons, terpenes, and the like.

Examples of the sulfoxides include dimethyl sulfoxide.

Examples of the sulfones include: dimethylsulfone, diethylsulfone, bis(2-hydroxyethyl) sulfone, and tetramethylene sulfone.

Examples of the amides include: N,N-dimethylformamide, N-methylformamide, N,N-dimethylacetamide, N-methylacetamide, and N,N-diethylacetamide.

Examples of the lactams include: N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone.

Examples of the imidazolidinones include: 1,3-dimethyl-2-imidazolidinone, 1,3-diethyl-2-imidazolidinone, and 1,3-diisopropyl-2-imidazolidinone.

Examples of the dialkyl glycol ethers include: dimethyl glycol, dimethyl diglycol, dimethyl triglycol, methyl ethyl diglycol, diethyl glycol, and triethylene glycol butyl methyl ether.

Examples of the monoalcohol-based solvents include: methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, 3-methyl-3-methoxybutanol, n-hexanol, 2-methylpentanol, sec-hexanol, 2-ethyl-1-butanol, sec-heptanol, 3-heptanol, 1-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, methyl isobutyl carbinol, phenol, cyclohexanol, methylcyclohexanol, 3,3,5-trimethylcyclohexanol, benzyl alcohol, phenylmethylcarbinol, diacetone alcohol, and cresol.

As the (poly)alkylene glycol monoalkyl ethers, for example, the following can be mentioned: ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether.

Examples of the (poly)alkylene glycol monoalkyl ether acetates include: ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, propylene glycol monoethyl ether acetate.

Examples of the other ethers include: dimethyl ether, diethyl ether, methyl ethyl ether, dipropyl ether, diisopropyl ether, dibutyl ether, diisoamyl ether, diethylene glycol dimethyl ether, diethylene glycol methylethyl ether, diethylene glycol monobutyl ether, diethylene glycol diethyl ether, tetraethylene glycol dimethyl ether, and tetrahydrofuran.

Examples of the ketones include: methyl ethyl ketone, cyclohexanone, 2-heptanone, 3-heptanone, and 2,6-dimethyl-4-heptanone.

Examples of the other esters may include: alkyl lactates, such as methyl lactate and ethyl lactate; ethyl 2-hydroxy-2-methylpropionate, methyl 3-methoxypropionate, ethyl 3-methoxypropionate, methyl 3-ethoxy propionate, ethyl 3-ethoxy propionate, ethyl ethoxyacetate, ethyl hydroxyacetate, methyl 2-hydroxy-3-methylbutanoate, 3-methoxybutyl acetate, 3-methyl-3-methoxy-1-butyl acetate, 3-methyl-3-methoxybutyl propionate, ethyl acetate, n-propyl acetate, isopropyl acetate, n-butyl acetate, isobutyl acetate, n-pentyl acetate, n-hexyl acetate, n-heptyl acetate, n-octyl acetate, n-pentyl formate, isopentyl acetate, n-butyl propionate, ethyl butyrate, n-propyl butyrate, isopropyl butyrate, butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate.

Examples of the lactones include: propiolactone, γ-butyrolactone, and 6-pentyrolactone.

Examples of the linear, branched, or cyclic aliphatic hydrocarbons include: n-hexane, n-heptane, n-octane, n-nonane, methyloctane, n-decane, n-undecane, n-dodecane, 2,2,4,6,6-pentamethylheptane, 2,2,4,4,6,8,8-heptamethylnonane, cyclohexane, and methylcyclohexane.

Examples of the aromatic hydrocarbons include: benzene, toluene, benzotrifluoride, xylene, 1,3,5-trimethylbenzene, naphthalene, and decahydronaphthalene.

Examples of the terpenes include: p-menthane, diphenylmenthane, limonene, terpinene, bornane, norbornane, and pinane.

The organic solvent has a relative dielectric constant of preferably 35 or less and more preferably 20 or less. As the organic solvent having such a low relative dielectric constant, for example, the following can be mentioned: methanol (relative dielectric constant: 33), isopropanol (IPA) (relative dielectric constant: 18.3), diethylene glycol monobutyl ether (BDG) (relative dielectric constant: 13.70), propylene glycol monomethyl ether (PE) (relative dielectric constant: 12.71), benzyl alcohol (relative dielectric constant: 13.70), 2-heptanone (relative dielectric constant: 11.74), ethylene glycol monobutyl ether acetate (relative dielectric constant: 8.66), tert-butanol (relative dielectric constant: 12.5), 1-octanol (relative dielectric constant: 10.21), isobutanol (relative dielectric constant: 18.22), benzotrifluoride (relative dielectric constant: 9.18), decahydronaphthalene (relative dielectric constant: 2.16), cyclohexane (relative dielectric constant: 1.99), decane (relative dielectric constant: less than 1), ethyl lactate (EL) (relative dielectric constant: 13.22), diethylene glycol monomethyl ether (relative dielectric constant: 15.76), 1-nonanol (relative dielectric constant: 9.13), toluene (relative dielectric constant: 2.37), propylene glycol monomethyl ether acetate (PM) (relative dielectric constant: 9.4), methyl isobutyl carbinol (MIBC) (relative dielectric constant: 10.47), 2,6-dimethyl-4-heptanol (relative dielectric constant: 2.98), 2-ethyl-1-butanol (relative dielectric constant: 12.6), 2-butanoneoxime (relative dielectric constant: 2.9), n-dibutyl ether (relative dielectric constant: 3.33), butyl butyrate (relative dielectric constant: 4.55), and 2,6-dimethyl-4-heptanone (relative dielectric constant: 9.82).

The solvent may be used singly, and two or more types thereof may be used.

Other Components

Examples of other components that can be blended in the surface-treatment agent include an acid, a basic nitrogen-containing compound, a pH adjusting agent, an antioxidant, an ultraviolet absorbent, a viscosity adjusting agent, and an antifoaming agent.

Method of Forming Surface-Treatment Agent

The surface-treatment agent is obtained by mixing a thiol having 8 or less carbon atoms with a solvent or other components to be included as necessary, by a known method.

Exposure

The method of exposing the surface of the substrate to the surface-treatment agent may be a liquid phase method or a gas phase method. As the liquid phase method, a method of exposing the substrate surface by applying (e.g., coating) the surface-treatment agent to the substrate surface by means of, for example, a dipping method or a spin coating method, a roll coating method, a doctor blade method, or the like can be mentioned. Examples of the vapor phase method include a method in which the surface of a substrate is exposed to a vapor containing a thiol having 8 or less carbon atoms as the surface-treatment agent. The atmosphere to which the vapor is exposed may be at an atmospheric pressure or a reduced pressure, and is preferably at a reduced pressure.

An exposure temperature is 10° C. or more and 90° C. or less, preferably 20° C. or more and 80° C. or less, more preferably 20° C. or more and 70° C. or less, and most preferably 20° C. or more and 30° C. or less. Exposure time period is preferably 20 seconds or more, more preferably 30 seconds or more, and most preferably 45 seconds or more, from the viewpoint that the surface treatment film formed has a thicker film thickness. The upper limit value of the exposure time period is not particularly limited, but is, for example, 2 hours or less, typically 1 hour or less, preferably 15 minutes or less, more preferably 5 minutes or less, and most preferably 2 minutes or less.

Solvent Cleaning Step

After the exposure step, a solvent cleaning step of cleaning the substrate 1 on which the surface treatment film 22 is formed with a solvent may be performed. By cleaning the substrate 1 on which the surface treatment film 22 is formed with a solvent, the surface treatment film 22 on the first region 11 can be removed in a case where the surface treatment film 22 is formed on the first region 11 during the exposure step, that is, when the surface treatment film 22 intrudes into the first region 11 during the exposure step.

Examples of the solvent to be used for cleaning in the solvent cleaning step include alcohols and fatty acid alkyl esters. Examples of the alcohols include methanol, ethanol, 1-propanol, 2-propanol (IPA), 1-butanol, 2-butanol, 2-methyl-1-propanol, 2-methyl-2-propanol, 1-pentanol, 2-pentanol, 4-methyl-2-pentanol, 2,2-dimethyl-1-propanol, benzyl alcohol, and phenethyl alcohol. Examples of the fatty acid alkyl esters include ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate.

The solvent used for cleaning in the solvent cleaning step may be one type or two or more types. When two or more types of solvents are used, a mixed solvent of two or more solvents may be used, or the substrate may be cleaned with one solvent, dried as necessary, and then cleaned with another solvent. For example, cleaning with alcohol may be followed by cleaning with a fatty acid alkyl ester.

Drying Step

After the exposure step or the cleaning step, a drying step of drying the substrate may be performed as necessary. Drying is carried out, for example, by a nitrogen blow.

According to the above-described method of forming a surface treatment film, even when the film thickness is large, the surface treatment film 22 in which the intrusion of the surface treatment film 22 onto the first region 11 is suppressed can be selectively formed on the second region 12. The film thickness of the surface treatment film 22 can be made, for example, 10 nm or more. Therefore, when a CVD film is formed on the first region 11 by the CVD method such as the ALD method after the surface treatment film 22 is formed on the second region 12, overhang of the CVD film can be suppressed even when the film thickness of the CVD film to be formed is thick (for example, 20 nm or more). In addition, since the intrusion of the surface treatment film 22 onto the first region 11 is suppressed, inhibition of the formation of the CVD film on the first region 11 by the surface treatment film 22 is suppressed, and thus the CVD film can be more selectively formed on the first region 11.

Method for Region-Selective Production of Film on Substrate Surface

By using the above-described method of forming a surface treatment film, a film can be selectively produced on a substrate surface by the CVD method such as the ALD method. Such a method for region selectively producing a film on a substrate surface is a region selective film forming method of a substrate surface including a surface treatment film forming step of forming a surface treatment film on the second region by the above-described surface treatment film forming method, and a CVD film forming step of forming a CVD film by a chemical vapor deposition method (CVD method) after the surface treatment film forming step, in which a larger amount of a material of the CVD film is deposited on the first region than on the second region.

The CVD film is formed of a material different from that of the surface treatment film 22, for example, an insulating material such as $SiO_2$. The surface treatment film 22 formed on the second region 12 by the above-described method of forming a surface treatment film can be made thick. Therefore, even if the thickness of the CVD film formed on the first region 11 is large, the overhang of the CVD film can be suppressed. Further, in the surface treatment film 22 formed on the second region 12 by the above-described method of forming a surface treatment film, since the intrusion of the surface treatment film 22 onto the first region 11 is suppressed, inhibition of the formation of the CVD film on the first region 11 by the surface treatment film 22 is suppressed, and thus the CVD film can be more selectively formed on the first region 11. Hereinafter, film formation (ALD film formation) by the ALD method as an example of the CVD method will be described.

Film Formation by ALD Method

Although the film forming method by the ALD method is not particularly limited, a film forming method performed by adsorption using at least two gas phase reactants (hereinafter, simply referred to as "precursor gas") is preferred. Adsorption using a precursor gas is preferably chemical adsorption. Specifically, a method including the following steps (a) and (b) and repeating the steps (a) and (b) at least 1 time (1 cycle) until a desired film thickness is obtained: (a) exposing the substrate having a surface treatment film formed by the above-described method of forming a surface treatment film to a pulse of a first precursor gas and (b) after the step (a), exposing the substrate to a pulse of a second precursor gas.

After the step (a) and before the step (b), the method may or may not include a plasma treatment step or a step of removing or emitting (purging) the first precursor gas and the reactant thereof by a carrier gas, a second precursor gas, or the like. After the step (b), the method may or may not include a plasma treatment step or a step of removing or purging the second precursor gas and the reactant thereof by a carrier gas or the like. Examples of the carrier gas include an inert gas such as nitrogen gas, argon gas, and helium gas.

Each pulse in each cycle and each layer formed are preferably self-controlled, and more preferably each layer formed is a single atomic layer. The monoatomic layer may have a film thickness of 5 nm or less, preferably 3 nm or less, more preferably 1 nm or less, and most preferably 0.5 nm or less.

Examples of the first precursor gas include: an organometal, a metal halide, and a metal oxide halide, and specifically, examples thereof include: tantalum pentaethoxide, tetrakis(dimethylamino) titanium, pentakis (dimethylamino) tantalum, tetrakis(dimethylamino) zirconium, tetrakis(dimethylamino) hafnium, tetrakis(dimethylamino) silane, copper hexafluoroacetylacetonate vinyltrimethylsilane, $Zn(C_2H_5)_2$, $Zn(CH_3)_2$, trimethylaluminum (TMA), $TaCl_5$, $WF_6$, $WOCl_4$, CuCl, $ZrCl_4$, $AlCl_3$, $TiCl_4$, $SiCl_4$, and $HfCl_4$.

Examples of the second precursor gas include a precursor gas capable of decomposing the first precursor or a precursor gas capable of removing the ligand of the first precursor, and examples thereof include: $H_2O$, $H_2O_2$, $O_2$, $O_3$, $NH_3$, $H_2S$, $H_2Se$, $PH_3$, $AsH_3$, $C_2H_4$, and $Si_2H_6$.

The exposure temperature in the step (a) is not particularly limited, but is, for example, 25° C. or more and 800° C. or less, preferably 50° C. or more and 650° C. or less, more preferably 100° C. or more and 500° C. or less, and most preferably 150° C. or more and 375° C. or less.

The exposure temperature in the step (b) is not particularly limited, and examples thereof include a temperature substantially equal to or higher than the exposure temperature in the step (a). The film formed by the ALD method is not particularly limited, but includes: a film containing a pure element (e.g., Si, Cu, Ta, and W), a film containing an oxide (e.g., $SiO_2$, $GeO_2$, $HfO_2$, $ZrO_2$, $Ta_2O_5$, $TiO_2$, $Al_2O_3$, ZnO, $SnO_2$, $Sb_2O_5$, $B_2O_3$, $In_2O_3$, and $WO_3$), a film containing a nitride (e.g., $Si_3N_4$, TiN, AlN, BN, GaN, and NbN), a film containing a carbide (e.g., SiC), a film containing a sulfide (e.g., CdS, ZnS, MnS, $WS_2$, and PbS), a film including a selenide (e.g., CdSe and ZnSe), a film containing a phosphide (GaP and InP), a film containing an arsenide (e.g., GaAs and InAs), or a mixture thereof.

EXAMPLES

Hereinafter, the present invention will be described more specifically based on the Examples and the Comparative Examples, but the present invention is not limited to the following Examples.

Example 1

Preparation of Surface-Treatment Agent 1-octanethiol was dissolved in n-octanol (organic solvent) so as to be 2% by mass based on the total mass of the surface-treatment agent and a surface-treatment agent was prepared.

Pretreatment and Surface Treatment

Figure 5A:
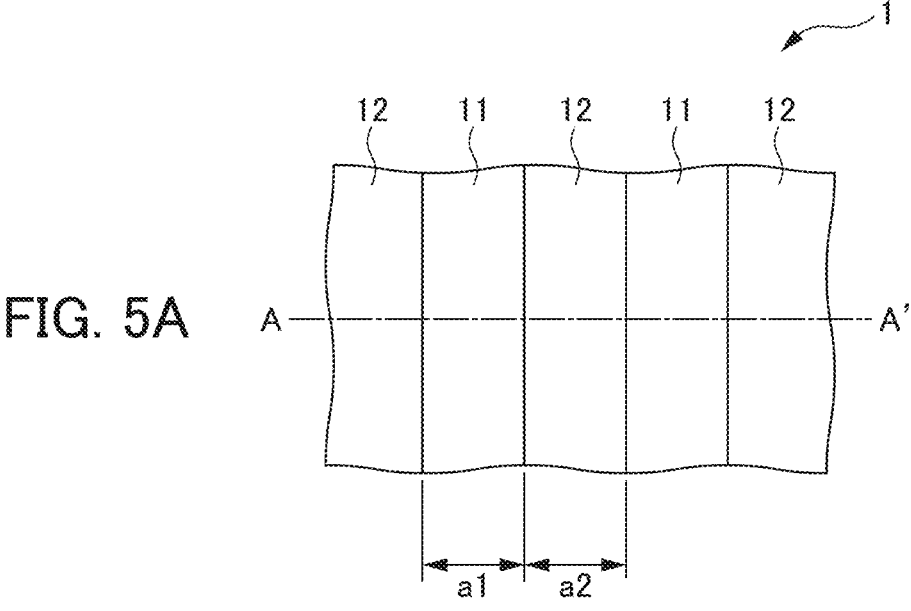
FIGS. 5A and 5B are schematic views illustrating a substrate used in Examples.
Figure 5B:
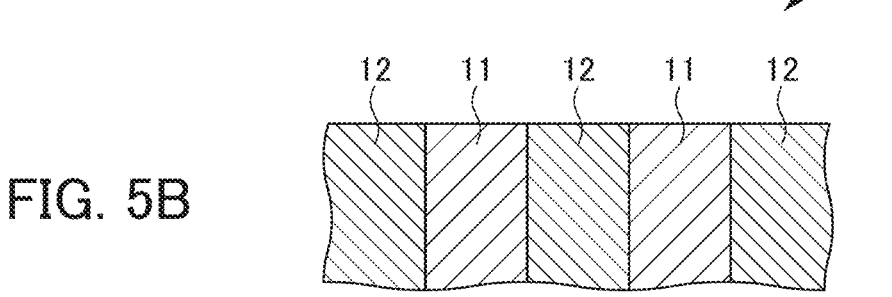

A substrate 1 having Cu and $SiO_2$ on a surface thereof was prepared (substrate preparation step). In the substrate 1, the surface thereof has, as shown in FIG. 5A, a patterned shape in which a plurality of rectangular first regions 11 made of $SiO_2$ and having a width a1 of 50 nm and a plurality of rectangular second regions 12 made of Cu and having a width a2 of 50 nm are alternately arranged on a line in a plan view. FIGS. 5A and 5B are schematic views of the substrate 1 used in the Example, FIG. 5A is a plan view, and FIG. 5B is a cross-sectional view taken along line A-A' of FIG. 5A. The prepared substrate having Cu and $SiO_2$ on a surface thereof was subjected to surface treatment by the following method using the obtained surface-treatment agent. Specifically, the substrate having Cu and $SiO_2$ on a surface thereof was dipped in a HF aqueous solution having a concentration of 0.5 mass % at 25° C. for 1 minute without stirring to perform a pretreatment. After the pretreatment, each substrate was cleaned with deionized water (DIW) for 1 minute. The substrate cleaned with water was dried with nitrogen stream for 1 minute. The dried substrate was placed in an atmosphere in which ozone was generated by irradiation of air with ultraviolet rays using an Hg lamp for 10 minutes to oxidize Cu on the substrate surface, thereby forming a CuO layer on the substrate surface (oxidation step). Then, the substrate was dipped in the surface-treatment agent at 25° C. for 1 minute without stirring to expose the substrate to the surface-treatment agent (exposure step). Thereafter, the substrate was dipped in isopropanol (IPA) at 25° C. for 1 minute without stirring, and then was dried with a nitrogen stream for 1 minute to obtain a substrate on which a surface treatment film was formed.

Example 2

The same operation as in Example 1 was performed except that 1-hexanethiol was used instead of 1-octanethiol.

Example 3

The same operation as in Example 1 was performed, except that 1-butanethiol was used instead of 1-octanethiol.

Example 4

The same operation as in Example 3 was performed except that the substrate was dipped in isopropanol (IPA) at 25° C. for 1 minute without stirring, was dried in a nitrogen stream for 1 minute, further was dipped in butyl butyrate at 25° C. for 1 minute without stirring, was cleaned with deionized water for 1 minute, and then was dried in a nitrogen stream for 1 minute.

Example 5

The same operation as in Example 1 was performed except that p-toluenethiol was used instead of 1-octanethiol.

Comparative Example 1

The same operation as in Example 3 was performed, except that the oxidation step was not performed.

Comparative Example 2

The same operation as in Example 1 was performed, except that 1-dodecanethiol was used instead of 1-octanethiol.

Comparative Example 3

The same operation as in Example 1 was performed, except that 1-decanethiol was used instead of 1-octanethiol.

Measurement of Thickness of Surface Treatment Film

For each of the obtained substrates, the film thickness of the surface treatment film formed on Cu was measured by fluorescent X-ray analysis, and was evaluated according to the following criteria. The results are shown in the "film thickness" column of Table 1. Good (indicated by circle symbol (o)): the film thickness of the surface treatment film was 10 nm or more. Poor (indicated by cross symbol (x)): the film thickness of the surface treatment film was less than 10 nm.

Evaluation of Rectangularity (Intrusion of the Surface Treatment Film Onto SiO$_2$)

For each of the obtained substrates, the surface treatment film was observed by atomic force microscope (AFM) analysis (device name: Dimension Icon, manufactured by Bruker) and the rectangularity was evaluated according to the following criteria. The results are shown in Table 1. Very good (indicated by bullseye symbol (O)): having very good rectangularity Good (indicated by circle symbol (o)): having good rectangularity Poor (indicated by cross symbol (x)): shape defects were observed.

Selectivity Evaluation

For each of the obtained substrates, cohesion force on the second region (Cu) 12 and cohesion force on the first region (SiO$_2$) 11 were measured by atomic force microscope analysis (AFM) (device name: Dimension Icon, manufactured by Bruker) under measurement conditions of an observation range of 1 μm×1 μm and the number of scans of 256 times, and the difference in cohesion forces was calculated using the following formula. The greater the difference in cohesion force, the higher the selectivity, meaning that a surface treatment film is selectively formed on the Cu surface of Cu and SiO$_2$. The results are shown in Table 1.

Difference in cohesion force [nN]=cohesion force on the first region [nN]−cohesion force on the second region [nN]

surface treatment films of Examples 1 to 5 were selectively formed on the surface of metallic matter (Cu). On the other hand, in the surface treatment film of Comparative Example 1 in which the oxidation step was not performed and the surface treatment films of Comparative Examples 2 and 3 in which the number of carbon atoms of the thiol contained in the surface-treatment agent was more than 8 had a large amount of intrusion onto the first region of the surface treatment film, and had poor rectangularity.

| EXPLANATION OF REFERENCE NUMERALS | |
| --- | --- |
| 1 | Substrate |
| 11 | First region |
| 12 | Second region |
| 21 | Metal oxide layer |
| 22 | Surface treatment film |

What is claimed is:

1. A method of forming a surface treatment film, comprising preparing a substrate having, on a surface thereof, a first region where an insulator is exposed and a second region where at least one metallic matter selected from a metal or a conductive metal-containing compound is exposed, oxidizing a surface of the second region, and exposing the surface of the substrate after the oxidizing to a surface-treatment agent comprising a thiol having 8 or fewer carbon atoms to form the surface treatment film on the second region, wherein the surface treatment film has a thickness of 10 nm or more, and

TABLE 1

| | Surface treatment agent | | Oxidation step | Cleaning step | Evaluation | | |
| --- | --- | --- | --- | --- | --- | --- | --- |
| | | | | | Film | Rectangularity | Selectivity (difference in cohesion |
| | Thiol | Solvent | UVO$_3$ | Solvent | thickness | (intrusion) | forces [nN]) |
| Comparative Example 1 | 1-butanethiol | n-octanol | No | IPA | X | X | — |
| Comparative Example 2 | 1-dodecanethiol | n-octanol | Yes | IPA | O | X | — |
| Comparative Example 3 | 1-decanethiol | n-octanol | Yes | IPA | O | X | — |
| Example 1 | 1-octanethiol | n-octanol | Yes | IPA | O | O | 0.60 |
| Example 2 | 1-hezanethiol | n-octanol | Yes | IPA | O | O | 0.78 |
| Example 3 | 1-butanethiol | n-octanol | Yes | IPA | O | ⊙ | 0.79 |
| Example 4 | 1-butanethiol | n-octanol | Yes | IPA, Butyl butyrate | O | ⊙ | 1.20 |
| Example 5 | p-toluenethiol | n-octanol | Yes | IPA | O | O | 0.65 |

As shown in Table 1, in the surface treatment films of Examples 1 to 5, which were formed by the surface treatment film forming method including a substrate preparation step of preparing a substrate having, on a surface thereof, a first region where an insulator (SiO$_2$) was exposed and a second region where a metallic matter (Cu) was exposed, an oxidation step of oxidizing a surface of the second region, and an exposure step of forming a surface treatment film on the second region by exposing the surface of the substrate to a surface-treatment agent containing a thiol having 8 or less carbon atoms after the oxidation step, it can be seen that even when the film thickness of the surface treatment film was as thick as 10 nm or more, the intrusion of the surface treatment film onto the first region can be suppressed, and the rectangularity was excellent. It was also found that the wherein the formation of the surface treatment film is configured to suppress an overhang of a second insulator formed on the insulator deposited on the first region.

2. The method of claim 1, wherein the insulator has a recess on a surface of the substrate and the second region where the metallic matter is exposed is formed in the recess.

3. The method of claim 1, wherein the insulator is at least one selected from the group consisting of silicon oxide, aluminum oxide, titanium oxide, zirconium oxide, hafnium oxide, tantalum oxide, a fluorine-containing silicon oxide, a carbon-containing silicon oxide, silicon nitride, boron nitride, silicon carbide, silicon carbonitride, silicon oxynitride, silicon oxycarbonitride, silicon, and silicon doped with at least one selected from phosphorus, boron, or germanium, and the metallic matter is at least one selected from the group consisting of copper, cobalt, molybdenum, and ruthenium.

4. The method of claim 1, wherein the thiol includes at least one selected from the group consisting of butanethiol, pentanethiol, hexanethiol, heptanethiol, of and octanethiol.

5. The method of claim 1, further comprising cleaning the substrate having the surface treatment film formed thereon, with a solvent after the exposing.

6. The method of claim 5, wherein the solvent includes a fatty acid alkyl ester.

\* \* \* \* \*